United States Patent
Xing et al.

(10) Patent No.: US 10,868,216 B2
(45) Date of Patent: Dec. 15, 2020

(54) DISPLAY DEVICES, LIGHT EMITTING DIODE CHIPS AND METHODS FOR MANUFACTURING THE SAME

(71) Applicants: Kunshan New Flat Panel Display Technology Center Co., Ltd., Kunshan (CN); Kunshan Go-Visionox Opto-Electronics Co., Ltd., Kunshan (CN)

(72) Inventors: Rubo Xing, Kunshan (CN); Dong Wei, Kunshan (CN); Xiaolong Yang, Kunshan (CN); Huimin Liu, Kunshan (CN)

(*) Notice: Subject to any disclaimer, the term of this patent is extended or adjusted under 35 U.S.C. 154(b) by 0 days.

(21) Appl. No.: 16/414,775

(22) Filed: May 16, 2019

(65) Prior Publication Data

US 2019/0273183 A1 Sep. 5, 2019

Related U.S. Application Data

(63) Continuation of application No. PCT/CN2018/100298, filed on Aug. 13, 2018.

(30) Foreign Application Priority Data

Mar. 29, 2018 (CN) .................... 2018 2 0437798 U

(51) Int. Cl.
*H01L 33/38* (2010.01)
*H01L 33/12* (2010.01)
(Continued)

(52) U.S. Cl.
CPC ............ *H01L 33/38* (2013.01); *H01L 25/167* (2013.01); *H01L 33/007* (2013.01);
(Continued)

(58) Field of Classification Search
CPC ....... H01L 33/38; H01L 33/12; H01L 33/007; H01L 33/32; H01L 33/0075;
(Continued)

(56) References Cited

U.S. PATENT DOCUMENTS 6,903,374 B2 * 6/2005 Katayama ........... H01L 257/102
8,362,459 B2 * 1/2013 Kim ..................... G02B 6/0073
257/13
(Continued)

FOREIGN PATENT DOCUMENTS

CN 1757161 A 4/2006
CN 1877874 A 12/2006
(Continued)

OTHER PUBLICATIONS

TW Office Action dated May 17, 2019 in the corresponding TW application (application No. 107130114).

*Primary Examiner* — Vu A Vu
(74) *Attorney, Agent, or Firm* — Kilpatrick Townsend & Stockton

(57) ABSTRACT

The present application relates to a light emitting diode chip including: a first semiconductor layer and a second semiconductor layer. The first semiconductor layer and the second semiconductor layer are laminated to each other, and have an exposed upper surface respectively. An electrode is provided on the upper surfaces of the first semiconductor layer and the second semiconductor layer respectively. The electrode has a first recess in a direction perpendicular to the upper surface.

17 Claims, 3 Drawing Sheets

(51) Int. Cl.
*H01L 33/00* (2010.01)
*H01L 33/32* (2010.01)
*H01L 25/16* (2006.01)
*H01L 33/62* (2010.01)

(52) U.S. Cl.
CPC .......... *H01L 33/0075* (2013.01); *H01L 33/12* (2013.01); *H01L 33/32* (2013.01); *H01L 33/62* (2013.01); *H01L 2933/0016* (2013.01)

(58) Field of Classification Search
CPC ................... H01L 25/167; H01L 33/62; H01L 2933/0016; H01L 25/0753; H01L 33/387
USPC ......................................................... 257/88
See application file for complete search history.

(56) References Cited

U.S. PATENT DOCUMENTS

| | | |
|---|---|---|
| 2004/0173816 A1 | 9/2004 | Saxler |
| 2006/0273336 A1 | 12/2006 | Fujikura et al. |
| 2013/0001508 A1 | 1/2013 | Lin et al. |
| 2014/0034981 A1 | 2/2014 | Hung Kuo-Hsin et al. |
| 2017/0110629 A1* | 4/2017 | Suh .......................... H01L 24/05 |
| 2019/0088819 A1 | 3/2019 | Ting et al. |

FOREIGN PATENT DOCUMENTS

| | | |
|---|---|---|
| CN | 101150156 A | 3/2008 |
| CN | 100459185 C | 2/2009 |
| CN | 101359704 A | 2/2009 |
| CN | 101834254 A | 9/2010 |
| CN | 203339217 U | 12/2013 |
| CN | 106856218 A | 6/2017 |
| KR | 20090078480 A | 7/2009 |
| TW | 201301552 A | 1/2013 |
| TW | 201407818 A | 2/2014 |
| TW | 201807840 A | 3/2018 |

* cited by examiner

DISPLAY DEVICES, LIGHT EMITTING DIODE CHIPS AND METHODS FOR MANUFACTURING THE SAME

CROSS-REFERENCES TO RELATED APPLICATIONS

This application is a continuation application of International Application No. PCT/CN2018/100298, filed on Aug. 13, 2018, which claims the priority to Chinese Patent Application No. 201820437798. X, entitled "DISPLAY DEVICES, LIGHT EMITTING DIODE CHIPS AND METHODS FOR MANUFACTURING THE SAME", and filed on Mar. 29, 2018. The entireties of both applications are incorporated by reference herein for all purposes.

FIELD

Exemplary embodiments of the present application relate to the field of display technologies, and particularly, to display devices, light-emitting diode chips and methods for manufacturing the same.

BACKGROUND

With the increasing progress of the light emitting diode (LED) chip technology, LED display technology taking LED as a pixel becomes possible. In a process of preparing an LED display device, LED chips distributed in an array need to be transferred to a driving back plate in batches, and then the LED chips are soldered to the driving back plate. At present, micron-scale LED chips have gradually become a mainstream of LED display devices. A Micro-LED (Micro-Light Emitting Diode) chip has a small effective soldering area due to a small size of electrodes. Thus, soldering strength between the electrodes of the Micro-LED chip and the driving back plate will directly affect reliability of a Micro-LED display device.

SUMMARY

In view of the above, exemplary embodiments of the present application provide display devices, light emitting diode chips, and methods for manufacturing the same, which can enhance contact between an electrode and a solder by capillarity action and improve soldering strength between the electrode and a driving back plate.

A technical solution of an exemplary embodiment of the present application is described below.

A light emitting diode chip includes:

a first semiconductor layer and a second semiconductor layer, the first semiconductor layer and the second semiconductor layer being laminated to each other, and the first semiconductor layer and the second semiconductor layer having an exposed upper surface respectively; and an electrode provided on the upper surfaces of the first semiconductor layer and the second semiconductor layer respectively, the electrode defining a first recess.

The electrode of the above-described light emitting diode chip is provided with the first recess. After liquefied, the solder is sucked into the first recess by capillarity action generated by the first recess, to increase the contact area between the solder and the electrode, thereby improving soldering strength.

In an exemplary embodiment, an inner surface of the first recess and the upper surface of the first semiconductor layer form a first angle ranging from 30 degrees to 90 degrees therebetween.

In an exemplary embodiment, the electrode further defines a second recess, and the second recess is juxtaposed with or nested with the first recess.

In an exemplary embodiment, an inner surface of the second recess and the upper surface of the first semiconductor layer form a second angle ranging from 30 degrees to 90 degrees therebetween.

In an exemplary embodiment, the second recess surrounds externally the first recess.

In an exemplary embodiment, the first recess and the second recess are concentric annuluses.

In an exemplary embodiment, the first semiconductor layer includes a p-type semiconductor layer; the second semiconductor layer includes an n-type semiconductor layer; and an active layer is provided between the first semiconductor layer and the second semiconductor layer.

In an exemplary embodiment, the light emitting diode chip includes a micro-light emitting diode chip having a size ranging from 1 μm to 100 μm.

In an exemplary embodiment, the first recess extends along a direction perpendicular to the upper surfaces of the first semiconductor layer and the second semiconductor layer.

In an exemplary embodiment, the first recess has an opening width smaller than a depth of the first recess.

In an exemplary embodiment, a half of a difference value between an opening width of the second recess and an opening width of the first recess is smaller than a depth of the second recess.

In an exemplary embodiment, the light emitting diode chip further includes a substrate, and a material of the substrate is any one of Si, SiC, GaN, ZnO and sapphire.

In an exemplary embodiment, the light emitting diode chip further includes a buffer layer provided between the substrate and the second semiconductor layer.

The present application further relates to a method for manufacturing a light emitting diode chip comprising:

forming a first semiconductor layer;

forming a second semiconductor layer laminated to the first semiconductor layer;

etching the first semiconductor layer to expose at least part of the second semiconductor layer;

depositing electrodes on exposed parts of the first semiconductor layer and the second semiconductor layer; and etching the electrodes to form a plurality of first recesses.

In an exemplary embodiment, the forming the first semiconductor layer and the second semiconductor layer laminated to each other specifically includes:

providing a substrate;

forming a buffer layer, the second semiconductor layer, an active layer and the first semiconductor layer on the substrate sequentially; and the method for manufacturing a light emitting diode chip further includes:

etching the active layer to expose a part of the second semiconductor layer.

In an exemplary embodiment, the method for manufacturing the light emitting diode chip further includes: etching the electrodes to form a plurality of second recesses.

In an exemplary embodiment, the etching the electrodes to form a plurality of first recesses includes: patterning the electrodes by a photolithography process to form the plurality of first recesses.

In an exemplary embodiment, the etching the electrodes to form a plurality of second recesses includes: patterning the electrodes by a photolithography process to form the plurality of second recesses.

An exemplary embodiment of the present application further relates to a display device, including: a driving circuit baseplate; and one or more light emitting diode chips being distributed in an array, the light emitting diode chips including:

a first semiconductor layer and a second semiconductor layer, the first semiconductor layer and the second semiconductor layer being laminated to each other, and the first semiconductor layer and the second semiconductor layer having an exposed upper surface respectively; and an electrode provided on the upper surfaces of the first semiconductor layer and the second semiconductor layer respectively, the electrode defining a first recess;

wherein the electrodes of the light emitting diode chips are fixedly connected to the driving circuit baseplate, the light emitting diode chips being electrically coupled to the driving circuit baseplate.

In an exemplary embodiment, the first recesses of the electrodes have a certain depth in a direction perpendicular to the driving circuit baseplate.

An electrode of a light emitting diode chip of the present application is provided with at least a first recess. The first recess has a structure beneficial to enhance the capillarity action of the electrode, so that after liquefied, the solder can be sucked into the electrode by the capillarity action generated by the first recess, increasing the contact area between the solder and the electrode, and allowing improved soldering strength.

BRIEF DESCRIPTION OF THE DRAWINGS

To illustrate the technical solutions according to the exemplary embodiments of the present application more clearly, the accompanying drawings for describing the exemplary embodiments are introduced briefly below. Apparently, the accompanying drawings in the following description are only some exemplary embodiments of the present application, and a person of ordinary skill in the art can derive other drawings from the accompanying drawings without creative efforts.

DETAILED DESCRIPTION OF THE INVENTION

In the prior art, in order to improve the soldering strength between the Micro-LED chip and the driving back plate, a solder is generally selected for improvement of the soldering strength. For example, a material, such as gold-tin alloy, soldering tin, and the like, is used. However, in a case of a small area of an electrode, a bonding force of the soldering is still insufficient.

Specific exemplary embodiments of the present application will be described in detail hereinafter with reference to the accompanying drawings.

Figure 1:
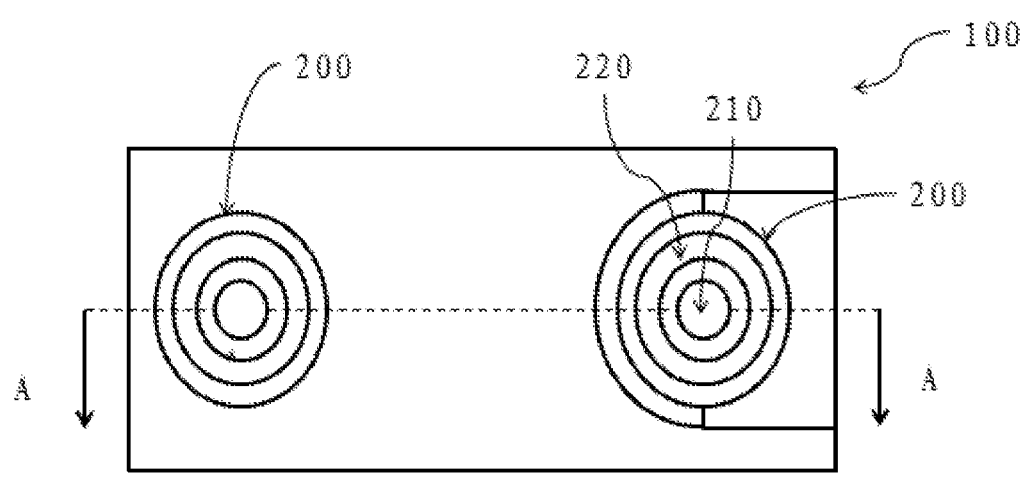
FIG. 1 is a schematic structural diagram of a light emitting diode according to an exemplary embodiment of the present application.
Figure 2:
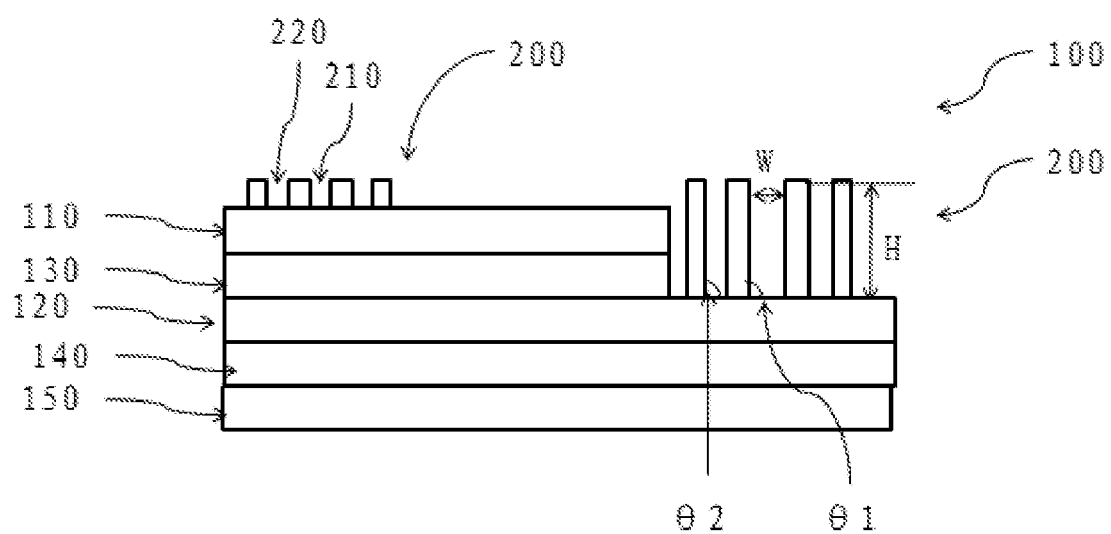
FIG. 2 is a schematic cross-sectional structural diagram of the light emitting diode shown in FIG. 1 along a sectional line A-A.

FIG. 1 is a schematic structural diagram of a light emitting diode according to an exemplary embodiment of the present application. FIG. 2 is a schematic cross-sectional structural diagram of the light emitting diode shown in FIG. 1 along a sectional line A-A. Referring to FIGS. 1 and 2, a light emitting diode chip 100 includes a first semiconductor layer 110 and a second semiconductor layer 120. The first semiconductor layer 110 includes a p-type semiconductor layer of the light emitting diode chip 100, and the second semiconductor layer 120 includes an n-type semiconductor layer of the light emitting diode chip 100. The first semiconductor layer 110 and the second semiconductor layer 120 constitute a core part of the light emitting diode chip 100. An active layer 130 is provided between the first semiconductor layer 110 and the second semiconductor layer 120. The active layer 130 may be a quantum well active layer having a thin film layer to reduce reabsorption of photons by the active layer 130.

The light emitting diode chip 100 may be any one of a GaP (gallium phoshpide) based light emitting diode, a GaN (gallium nitride) based light emitting diode and a ZnO (zinc oxide) based light emitting diode. In an exemplary embodiment, the light emitting diode chip 100 is a GaN based light emitting diode chip. The first semiconductor layer 110 is a p-GaN layer, and the second semiconductor layer 120 is an n-GaN layer.

As shown in FIG. 2, the light emitting diode chip 100 further includes a substrate 150. A material of the substrate 150 may be any one of Si (silicon), SiC (silicon carbide), GaN, ZnO and sapphire substrate.

As shown in FIG. 2, the light emitting diode chip 100 further includes a buffer layer 140. The buffer layer 140 is provided between the substrate 150 and the second semiconductor layer 120. The buffer layer 140 can have good wettability into the substrate 150, and is beneficial for nucleation. In an exemplary embodiment, the buffer layer 140 has a material of GaN.

In an exemplary embodiment, the light emitting diode chip includes a micro-light emitting diode chip having a size ranging from 1 μm to 100 μm.

Referring to FIGS. 1 and 2, the first semiconductor layer 110 and the second semiconductor layer 120 may be laminated to each other. The first semiconductor layer 110 and the second semiconductor layer 120 have an exposed upper surface respectively. An electrode 200 is provided on the exposed upper surfaces of the first semiconductor layer 110 and the second semiconductor layer 120 respectively. A part of the second semiconductor layer 120 may be exposed by etching, and the electrode 200 is provided on the exposed upper surface.

In an exemplary embodiment, the electrode 200 defines a first recess 210. The first recess 210 extends along a direction perpendicular to the upper surfaces of the first semiconductor layer 110 and the second semiconductor layer 120.

The electrode 200 of the light emitting diode chip 100 of the exemplary embodiment of the present application is provided with the first recess 210. After liquefied, the solder is sucked into the first recess 210 by capillarity action generated by the first recess 210, to increase the contact area between the solder and the electrode, thereby improving soldering strength.

In an exemplary embodiment, an inner surface of the first recess 210 and the upper surface of the first semiconductor layer 110 form a first angle θ1 ranging from 30 degrees to 90 degrees therebetween. A degree of the first angle θ1 formed by the inner surface of the first recess 210 and the upper surface of the first semiconductor layer 110 may be different from a degree of an angle formed by the inner surface of the first recess 210 and the upper surface of the second semiconductor layer 120.

It should be understood that, when the first angle θ1 is smaller than a contact angle between the solder and the inner surface of the first recess 210, the first recess 210 advantageously generate the capillarity action, so as to suck the solder into the first recess 210. Even though the light emitting diode chip has a micron size, and the first recess 210 on the electrode 200 has a very small size, the solder can flow into a recessed portion of the electrode 200, thereby improving the soldering strength. The first angle θ1 in the range from 30 degrees to 90 degrees may satisfy requirements of most solder, and ensure that the solder can flow into the first recess 210 of the electrode 200.

In an exemplary embodiment, the first recess 210 has an opening width W smaller than a depth H of the first recess 210. When the first recess 210 has an elongated structure with a relatively small pore size, the more obvious the capillarity action is, the easier the solder enters the first recess 210.

In an exemplary embodiment, the electrode 200 not only defines the first recess 210, but also defines a second recess 220. An inner surface of the second recess and the upper surface of the first semiconductor layer form a second angle θ2 ranging from 30 degrees to 90 degrees therebetween. A degree of the second angle θ2 formed by the inner surface of the second recess 220 and the upper surface of the first semiconductor layer 110 may be different from a degree of an angle formed by the inner surface of the second recess 220 and the upper surface of the second semiconductor layer 120. An ability of the solder to flow into the electrode 200 may be further increased by the second recess 220 of the electrode 200.

The second recess 220 may be juxtaposed with the first recess 210 in a same direction. A cross-sectional shape of the first recess 210 and the second recess 220 is not limited to a circular shape, a square shape, a rectangular shape, an arbitrary quadrilateral shape, or other polygonal shapes. The second recess 220 may have a structure that is nested with the first recess 210. For convenience of fabrication, the second recess 220 may surround externally the first recess 210, and a gap is present between the second recess 220 and the first recess 210.

In an exemplary embodiment, the first recess 210 and the second recess 220 are concentric annuluses.

In an exemplary embodiment, a half of a difference value between the opening width of the second recess 220 and the opening width of the first recess 210 is smaller than a depth of the second recess 220, so that a difference value of pore sizes between the first recess 210 and the second recess 220 is smaller than the depth of the second recess 220, thereby enhancing the capillarity action, and allowing the solder to enter the gap between the first recess 210 and the second recess 220 more easily.

In an exemplary embodiment, the electrode 200 may define a plurality of recesses in addition to the first recess 210 and the second recess 220. The plurality of recesses may be juxtaposed, may be nested with each other, and may be distributed in a labyrinth structure to improve the contact between the electrode 200 and the solder as much as possible.

To realize the above-described structure of the light emitting diode, a method for manufacturing the light emitting diode chip 100 may include: firstly, providing a substrate; forming the buffer layer 140, the second semiconductor layer 120, the active layer 130, and the first semiconductor layer 110 on the substrate 150 sequentially; then etching the first semiconductor layer 110 and the active layer 130 to expose a part of the second semiconductor layer 120; depositing the electrodes 200 on exposed parts of the first semiconductor layer 110 and the second semiconductor layer 120; finally, etching the electrodes 200 to form a plurality of the first recesses 210.

In an exemplary embodiment, the method for manufacturing the light emitting diode chip may further include: etching the electrodes 200 to form a plurality of the second recesses 220.

In an exemplary embodiment, the electrodes 200 may be patterned by a photolithography process to form a plurality of the first recesses 210.

In an exemplary embodiment, the electrodes 200 may also be patterned by a photolithography process to form a plurality of the second recesses 220.

Figure 3:
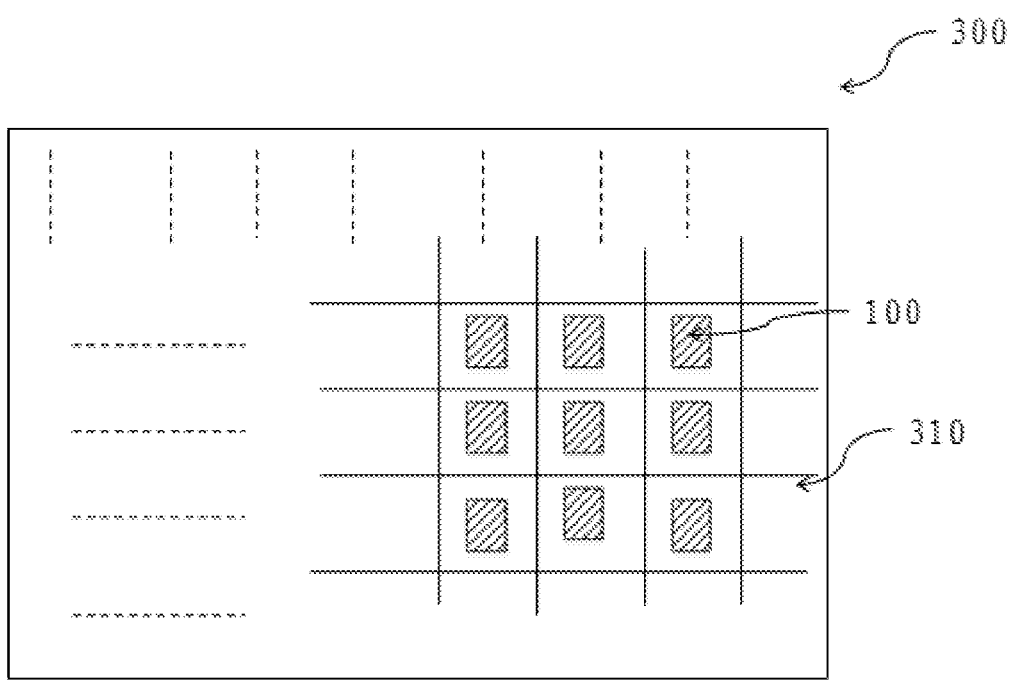
FIG. 3 is a schematic structural diagram of a display device according to an exemplary embodiment of the present application.

FIG. 3 is a schematic structural diagram of a display device according to an exemplary embodiment of the present application. As shown in FIG. 3, an exemplary embodiment of the present application further relates to a display device 300. The display device 300 includes: a driving circuit baseplate 310 and one or more light emitting diode chips 100 distributed in an array. Electrodes 200 of the light emitting diode chips 100 are fixedly connected to the driving circuit baseplate 310, to electrically connect the array of the light emitting diode chips 100 to the driving circuit baseplate 310.

In an exemplary embodiment, the electrodes 200 have first recesses 210, and the first recesses 210 have a depth in a direction perpendicular to the driving circuit baseplate 310, so that a cavity structure or a groove structure is formed on the electrodes 200 by the first recesses 210. In an exemplary embodiment, an opening width W of the first recesses 210 is smaller than a depth H of the first recesses 210 (referring to FIG. 2), so that the first recesses have an elongated structure with a relatively small pore size, thereby enhancing the capillarity action and facilitating the solder to enter the first recesses 210 more easily.

The patterned electrodes 200 is used in the display device 300 of the present application, and the first recesses 210 are provided on the electrodes 200, increasing the contact between the electrodes 200 and the solder, improving the soldering strength of the light emitting diode chip 100, and enhancing reliability of the display device 300.

In an exemplary embodiment, the light emitting diode chip 100 may emit one of red light, green light, or blue light.

Each of technical features of the above-described exemplary embodiments may be combined arbitrarily. To simplify the description, not all of possible combinations of each of the technical features in the above exemplary embodiments are described. However, all of the combinations of these technical features should be considered as within the scope of the present specification, as long as such combinations do not contradict with each other.

The above exemplary embodiments merely illustrate several exemplary embodiments of the present application, and the description thereof is specific and detailed, but it shall not be constructed as limiting the scope of the present application. It should be noted that, for a person of ordinary skill in the art, several variations and improvements may be made without departing from the concept of the present application, and these are all within the protection scope of the present application. Therefore, the protection scope of the present application shall be subject to the appended claims.

The invention claimed is:

1. A light emitting diode chip, comprising:
   a first semiconductor layer and a second semiconductor layer, the first semiconductor layer and the second semiconductor layer being laminated to each other, and the first semiconductor layer and the second semiconductor layer having an exposed upper surface respectively; and an electrode provided on the upper surfaces of the first semiconductor layer and the second semiconductor layer respectively, the electrode defining a first recess, wherein an inner surface of the first recess and the upper surface of the first semiconductor layer form a first angle different from a degree of an angle formed by the inner surface of the first recess and the upper surface of the second semiconductor layer, wherein the electrode further defines a second recess, and the second recess is juxtaposed with or nested with the first recess, and a half of a difference value between an opening width of the second recess and an opening width of the first recess is smaller than a depth of the second recess.

2. The light emitting diode chip according to claim 1, wherein the first angle formed between the inner surface of the first recess and the upper surface of the first semiconductor layer ranges from 30 degrees to 90 degrees.

3. The light emitting diode chip according to claim 1, wherein an inner surface of the second recess and the upper surface of the first semiconductor layer form a second angle ranging from 30 degrees to 90 degrees therebetween.

4. The light emitting diode chip according to claim 1, wherein the second recess surrounds externally the first recess.

5. The light emitting diode chip according to claim 4, wherein the first recess and the second recess are concentric annuluses.

6. The light emitting diode chip according to claim 1, wherein:

the first semiconductor layer comprises a p-type semiconductor layer;

the second semiconductor layer comprises an n-type semiconductor layer; and an active layer is provided between the first semiconductor layer and the second semiconductor layer.

7. The light emitting diode chip according to claim 1, wherein the light emitting diode chip comprises a micro-light emitting diode chip having a size ranging from 1 μm to 100 μm.

8. The light emitting diode chip according to claim 1, wherein the first recess extends along a direction perpendicular to the upper surfaces of the first semiconductor layer and the second semiconductor layer.

9. The light emitting diode chip according to claim 1, wherein the first recess has an opening width smaller than a depth of the first recess.

10. The light emitting diode chip according to claim 1, wherein:

the light emitting diode chip further comprises a substrate, and a material of the substrate is any one of Si, SiC, GaN, ZnO and sapphire.

11. The light emitting diode chip according to claim 10, wherein the light emitting diode chip further comprises a buffer layer provided between the substrate and the second semiconductor layer.

12. A method for manufacturing a light emitting diode chip, comprising:

forming a first semiconductor layer and a second semiconductor layer laminated to each other, wherein the first semiconductor layer has an upper surface;

etching the first semiconductor layer to expose at least part of an upper surface of the second semiconductor layer;

depositing electrodes on exposed parts of the first semiconductor layer and the second semiconductor layer;

etching the electrodes to form a plurality of first recesses; and etching the electrodes to form a plurality of second recesses, wherein an inner surface of the first recess and the upper surface of the first semiconductor layer form a first angle different from a degree of an angle formed by the inner surface of the first recess and the upper surface of the second semiconductor layer, wherein the second recess is juxtaposed with or nested with the first recess, and a half of a difference value between an opening width of the second recess and an opening width of the first recess is smaller than a depth of the second recess.

13. The method for manufacturing a light emitting diode chip according to claim 12, wherein the forming the first semiconductor layer and the second semiconductor layer laminated to each other comprises:

providing a substrate;

forming a buffer layer, the second semiconductor layer, an active layer, and the first semiconductor layer on the substrate sequentially; and the method for manufacturing a light emitting diode chip further comprises:

etching the active layer to expose a part of the second semiconductor layer.

14. The method for manufacturing a light emitting diode chip according to claim 12, wherein the etching the electrodes to form a plurality of first recesses comprises patterning the electrodes by a photolithography process to form the plurality of first recesses.

15. The method for manufacturing a light emitting diode chip according to claim 12, wherein the etching the electrodes to form a plurality of second recesses comprises patterning the electrodes by a photolithography process to form the plurality of second recesses.

16. A display device, comprising:

a driving circuit baseplate; and one or more light emitting diode chips being distributed in an array, the light emitting diode chips comprising:

a first semiconductor layer and a second semiconductor layer, the first semiconductor layer and the second semiconductor layer being laminated to each other, and the first semiconductor layer and the second semiconductor layer having an exposed upper surface respectively; and an electrode provided on the upper surfaces of the first semiconductor layer and the second semiconductor layer respectively, the electrode defining a first recess;

wherein electrodes of the light emitting diode chips are connected to the driving circuit baseplate, the light emitting diode chips being electrically coupled to the driving circuit baseplate, and wherein an inner surface of the first recess and the upper surface of the first semiconductor layer form a first angle different from a degree of an angle formed by the inner surface of the first recess and the upper surface of the second semiconductor layer, wherein the electrode further defines a second recess, and the second recess is juxtaposed with or nested with the first recess, and a half of a difference value between an opening width of the second recess and an opening width of the first recess is smaller than a depth of the second recess.

17. The display device according to claim 16, wherein, the first recesses of the electrodes have a certain depth in a direction perpendicular to the driving circuit baseplate.

* * * * *